(12) United States Patent
Shin et al.

(10) Patent No.: US 9,196,376 B2
(45) Date of Patent: Nov. 24, 2015

(54) SEMICONDUCTOR DEVICES AND SEMICONDUCTOR SYSTEMS INCLUDING THE SAME

(71) Applicant: SK hynix Inc., Icheon-si, Gyeonggi-do (KR)

(72) Inventors: Tae Kyun Shin, Icheon-si (KR); Gwang Young Stanley Jeong, Dublin, CA (US)

(73) Assignee: SK Hynix Inc., Gyeonggi-do (KR)

( * ) Notice: Subject to any disclaimer, the term of this patent is extended or adjusted under 35 U.S.C. 154(b) by 92 days.

(21) Appl. No.: 14/174,744

(22) Filed: Feb. 6, 2014

(65) Prior Publication Data

US 2015/0221394 A1 Aug. 6, 2015

(51) Int. Cl.
*G11C 17/16* (2006.01)
*G11C 17/18* (2006.01)
*G11C 29/02* (2006.01)

(52) U.S. Cl.
CPC .............. *G11C 17/16* (2013.01); *G11C 17/18* (2013.01); *G11C 29/02* (2013.01)

(58) Field of Classification Search
CPC .................................................. G11C 29/027
USPC ......................................................... 365/200
See application file for complete search history.

(56) References Cited

U.S. PATENT DOCUMENTS

| | | | |
|---|---|---|---|
| 8,068,113 B2 | 11/2011 | Iizuka et al. | |
| 2002/0093862 A1* | 7/2002 | Akioka | 365/201 |
| 2003/0112693 A1* | 6/2003 | Gatzemeier et al. | 365/230.03 |
| 2006/0221729 A1* | 10/2006 | Iwai et al. | 365/200 |
| 2006/0227617 A1* | 10/2006 | Otsuka | 365/185.22 |
| 2009/0204847 A1* | 8/2009 | Lakhani et al. | 714/8 |
| 2010/0284233 A1* | 11/2010 | Kim et al. | 365/200 |
| 2011/0280091 A1* | 11/2011 | Rooney et al. | 365/200 |
| 2014/0169118 A1* | 6/2014 | Kim et al. | 365/230.06 |

FOREIGN PATENT DOCUMENTS

KR 1020110121184 A 11/2011

* cited by examiner

*Primary Examiner* — Min Huang
(74) *Attorney, Agent, or Firm* — William Park & Associates Ltd.

(57) ABSTRACT

A semiconductor device including a first latch unit suitable for storing a first address of a first memory cell tested in a first cell array block, a second latch unit suitable for storing a second address of a second memory cell tested in a second cell array block, a first selector suitable for receiving a first selection signal or a second selection signal to output any one of the first address and the second address as a selected address, and a program controller suitable for determining whether the selected address has to be stored in a fuse array and to control an operation for programming the fuse array.

17 Claims, 3 Drawing Sheets

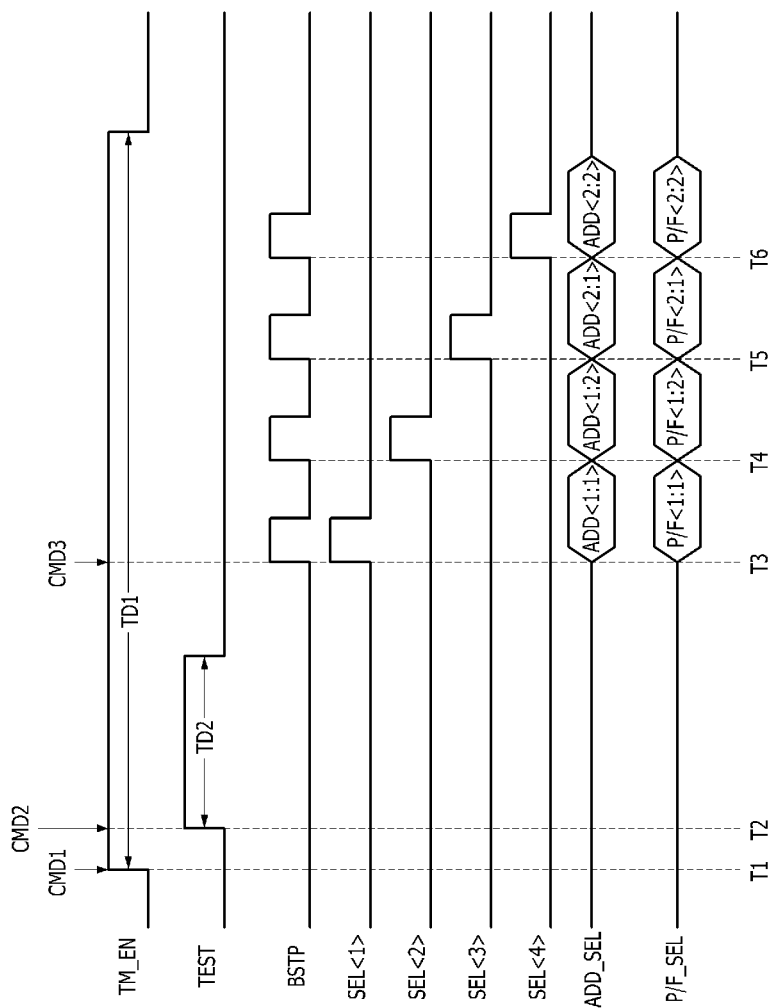

SEMICONDUCTOR DEVICES AND SEMICONDUCTOR SYSTEMS INCLUDING THE SAME

BACKGROUND

1. Technical Field

Embodiments of the present disclosure relate to semiconductor devices and semiconductor systems including the same.

2. Related Art

Semiconductor devices may be regarded as failed devices if at least one of memory cells included in each of the semiconductor devices abnormally operates. As the semiconductor devices become more highly integrated, the number of the failed devices has been continuously increased. Thus, the semiconductor devices may be designed to include redundancy cells. That is, if the semiconductor device has abnormal memory cells, a repair operation may be executed to replace the abnormal memory cells with the redundancy cells. The semiconductor device may store information on the abnormal memory cells therein to execute the repair operation.

Each of the semiconductor devices may be designed to include fuses that store information necessary for various internal control operations, for example, the information on the abnormal memory cells. General fuses can be programmed in a wafer level because a logic level of each data is determined according to an electrical open/short state of each fuse. However, once the semiconductor devices are encapsulated to form semiconductor packages, it may be impossible to program the general fuses in the semiconductor packages. E-fuses are widely used to solve the aforementioned disadvantage. Each of the e-fuses may be realized using a transistor, for example, a nonvolatile memory (NVM) cell transistor having a floating gate or a charge trapping layer. In such a case, data may be stored in the e-fuse by programming or erasing the transistor to change a threshold voltage of the transistor. That is, the e-fuse may be electrically open or short according to a resistance value between a source and a drain of the transistor employed as the e-fuse.

In order to correctly recognize the data stored in the e-fuses, a size of the transistors employed as the e-fuses has to be increased or amplifiers have to be used without increasing the size of the transistors employed as the e-fuses. However, in any case, there may be limitations in increasing the integration density of the semiconductor devices including the e-fuses.

Recently, e-fuse arrays have been proposed to solve the limitations of the integration density and to store the information necessary for various internal control operations. In the event that the e-fuse arrays are employed in the semiconductor devices, the e-fuse arrays may share the amplifiers with each other. Accordingly, the integration density of the semiconductor devices may be improved.

SUMMARY

Various embodiments are directed to semiconductor devices including a program controller and semiconductor systems including the same.

According to some embodiments, a semiconductor device includes a first latch unit suitable for storing a first address of a first memory cell tested in a first cell array block, a second latch unit suitable for storing a second address of a second memory cell tested in a second cell array block, a first selector suitable for receiving a first selection signal or a second selection signal to output any one of the first address and the second address as a selected address, and a program controller suitable for determining whether the selected address has to be stored in a fuse array to control an operation for programming the fuse array.

According to further embodiments, a semiconductor device includes a first latch unit, a second latch unit, a first selector, and a program controller. The first latch unit is suitable for storing a first address of a first memory cell and a second address of a second memory cell. The first memory cell and the second memory cell are tested in a first cell array block. The second latch unit is suitable for storing a third address of a third memory cell and a fourth address of a fourth memory cell. The third and fourth memory cells are tested in a second cell array block. The first selector is suitable for receiving one of first to fourth selection signals to output any one of the first to fourth addresses as a selected address. The program controller is suitable for determining whether the selected address has to be stored in a fuse array to control an operation for programming the fuse array.

According to further embodiments, a semiconductor system includes a controller and a semiconductor device. The controller is suitable for sequentially generating a first command signal, a second command signal and a third command signal. The semiconductor device is suitable for receiving the first command signal to operate in a test mode. The semiconductor device is suitable for receiving the second command signal to test memory cells included in first and second cell array blocks and to extract and latch addresses and pass/fail information on the tested memory cells. The semiconductor device is suitable for receiving the third command signal to sequentially generate a pulse of a first selection signal and a pulse of a second selection signal. The semiconductor device is suitable for controlling an operation for programming a fuse array in response to the pulses of the first and second selection signals. The fuse array is programmed according to the pass/fail information, and at least one of the addresses of the tested memory cells is stored in the fuse array when the fuse array is programmed.

BRIEF DESCRIPTION OF THE DRAWINGS

Embodiments of the present invention will become more apparent in view of the attached drawings and accompanying detailed description, in which:

FIG. 3 is a timing diagram illustrating an operation of the semiconductor system shown in FIG. 1.

DETAILED DESCRIPTION

Embodiments of the present invention will be described hereinafter with reference to the accompanying drawings. However, the embodiments described herein are for illustrative purposes only and are not intended to limit the scope of the invention.

Figure 1:
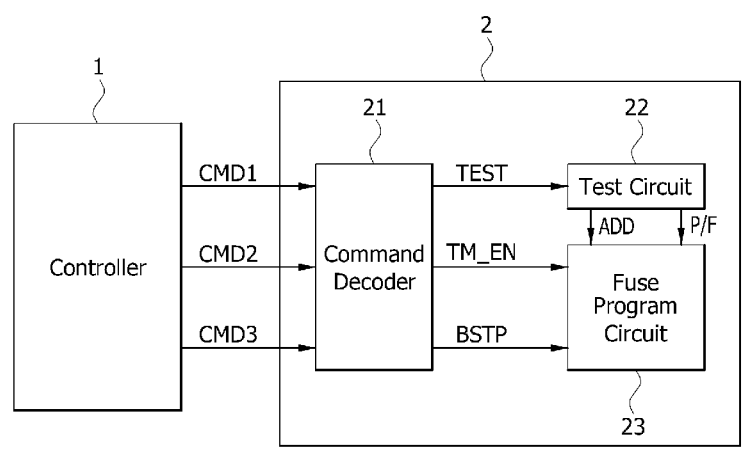
FIG. 1 is a block diagram illustrating a semiconductor system according to an embodiment.

Referring to FIG. 1, a semiconductor system according to an embodiment may include a controller 1 and a semiconductor device 2.

The controller 1 may sequentially apply a first command signal CMD1, a second command signal CMD2, and a third command signal CMD3 to the semiconductor device 2. In some embodiments, the first command signal CMD1, the second command signal CMD2 and the third command signal CMD3 may be obtained from the same command signal and may be generated such that logic combinations of the first, second and third command signals CMD1, CMD2 and CMD3 are different from each other. Alternatively, the first, second and third command signals CMD1, CMD2 and CMD3 may be obtained from three different command signals.

The semiconductor device 2 may include a command decoder 21, a test circuit 22 and a fuse program circuit 23. The command decoder 21 may receive the first, second and third command signals CMD1, CMD2 and CMD3 to generate a test mode enablement signal TM_EN, a test signal TEST and a burst pulse signal BSTP. The command decoder 21 may receive the first command signal CMD1 to generate the test mode enablement signal TM_EN enabled in a test mode. The command decoder 21 may receive the second command signal CMD2 to generate the test signal TEST enabled while a test is executed to determine whether memory cells in the cell array blocks (not shown) are normally operating or not. The command decoder 21 may receive the third command signal CMD3 to generate the burst pulse signal BSTP including pulses which are sequentially toggled. While the test signal TEST is enabled, the test circuit 22 may test the functions of the memory cells in the cell array blocks to extract addresses ADD and pass/fail information P/F on the tested memory cells. The fuse program circuit 23 may latch the addresses ADD and the pass/fail information P/F to store the latched data therein. While the test mode enablement signal TM_EN is enabled, the fuse program circuit 23 may control an operation for programming a fuse array (237 of FIG. 2) in response to the burst pulse signal BSTP to store the addresses ADD and the pass/fail information P/F in the fuse array 237.

A configuration of the fuse program circuit 23 will be described more fully hereinafter with reference to FIG. 2. In the present embodiment, it may be assumed that each of a first cell array block and a second cell block has two memory cells and addresses and pass/fail information on the memory cells are latched in the fuse program circuit 23.

Figure 2:
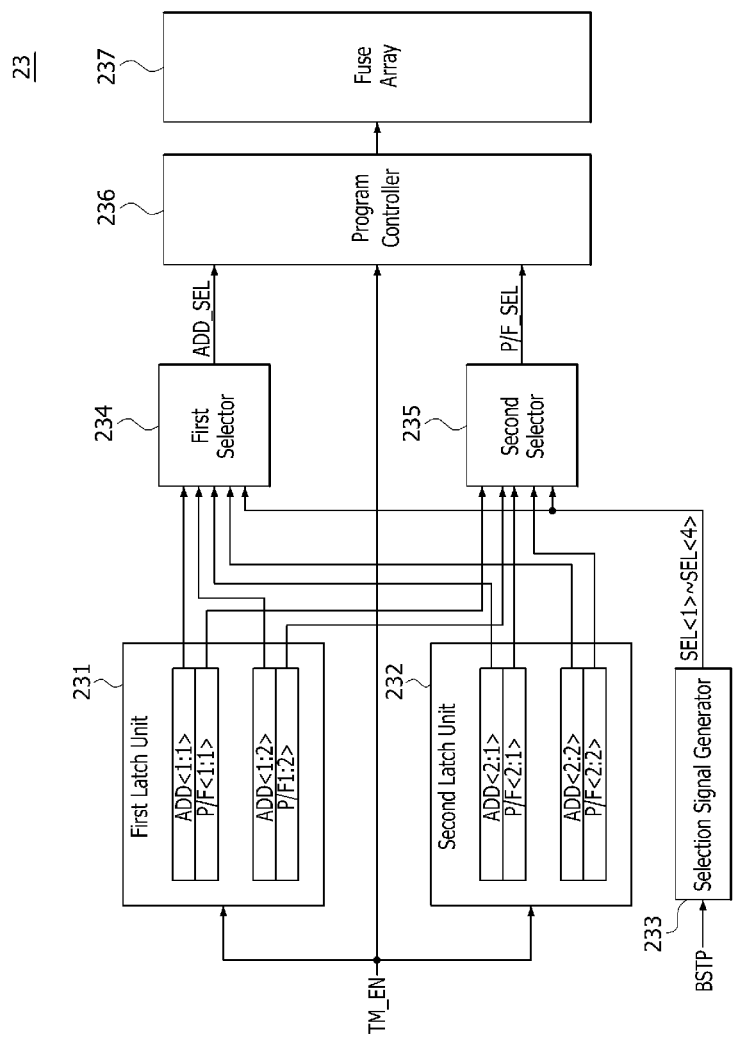
FIG. 2 is a block diagram illustrating a fuse program circuit included in the semiconductor system of FIG. 1.

Referring to FIG. 2, the fuse program circuit 23 may include a first latch unit 231, a second latch unit 232, a selection signal generator 233, a first selector 234, a second selector 235, a program controller 236 and a fuse array 237.

The first latch unit 231 may latch a first address ADD<1:1> and a first pass/fail information P/F<1:1> on a first memory cell which is tested in a first cell array block (not shown). Further, the first latch unit 231 may latch a second address ADD<1:2> and a second pass/fail information P/F<1:2> on a second memory cell which is tested in the first cell array block. The second latch unit 232 may latch a third address ADD<2:1> and a third pass/fail information P/F<2:1> on a third memory cell which is tested in a second cell array block (not shown). Further, the second latch unit 232 may latch a fourth address ADD<2:2> and a fourth pass/fail information P/F<2:2> on a fourth memory cell which is tested in the second cell array block. The first to fourth addresses ADD<1:1>, ADD<1:2>, ADD<2:1> and ADD<2:2> and the first to fourth pass/fail information P/F<1:1>, P/F<1:2>, P/F<2:1> and P/F<2:2> may be extracted by testing functions of the first to fourth memory cells included in the first and second cell array blocks using the test circuit 22 and may be stored in the first and second latch units 231 and 232. The first pass/fail information P/F<1:1> may include information on whether the first memory cell accessed by the first address ADD<1:1> normally operates or not, and the second pass/fail information P/F<1:2> may include information on whether the second memory cell accessed by the second address ADD<1:2> normally operates or not. Similarly, the third pass/fail information P/F<2:1> may include information on whether the third memory cell accessed by the third address ADD<2:1> normally operates or not, and the fourth pass/fail information P/F<2:2> may include information on whether the fourth memory cell accessed by the fourth address ADD<2:2> normally operates or not. For example, if the first pass/fail information P/F<1:1> has a logic "high" level and the second pass/fail information P/F<1:2> has a logic "low" level, the first memory cell in the first cell array block may correspond to a abnormal cell (i.e., a failed cell) and the second memory cell in the first cell array block may correspond to a normal cell. The logic level of each of the first to fourth pass/fail information P/F<1:1>, P/F<1:2>, P/F<2:1> and P/F<2:2> for discriminating the normality or the abnormality of each memory cell may be set to be different according to the embodiments.

The selection signal generator 233 may sequentially generate first to fourth selection signals SEL<1>, SEL<2>, SEL<3> and SEL<4> in synchronization with pulses included in the burst pulse signal BSTP. The selection signal generator 233 may generate a pulse of the first selection SEL<1> in synchronization with a first pulse of the burst pulse signal BSTP. The selection signal generator 233 may generate a pulse of the second selection SEL<2> in synchronization with a second pulse of the burst pulse signal BSTP. The selection signal generator 233 may generate a pulse of the third selection SEL<3> in synchronization with a third pulse of the burst pulse signal BSTP. The selection signal generator 233 may generate a pulse of the fourth selection SEL<4> in synchronization with a fourth pulse of the burst pulse signal BSTP. The number of the pulses included in the burst pulse signal BSTP and the number of the selection signals generated by the selection signal generator 233 may be set to be different according to the embodiments.

The first selector 234 may output any one selected from the first to fourth addresses ADD<1:1>, ADD<1:2>, ADD<2:1> and ADD<2:2> in response to one of the first to fourth selection signals SEL<1>~SEL<4>. The second selector 235 may output any one selected from the first to fourth pass/fail information P/F<1:1>, P/F<1:2>, P/F<2:1> and P/F<2:2> in response to one of the first to fourth selection signals SEL<1>~SEL<4>. The program controller 236 may control an operation for programming the fuse array 237 to store the selected address ADD_SEL and the selected pass/fail information P/F_SEL in the fuse array 237. The operation for programming the fuse array 237 may be executed using a general method for programming nonvolatile memory devices.

An operation of the semiconductor system having the aforementioned configuration will be described hereinafter with reference to FIGS. 1, 2 and 3.

First, at a point of time "T1", the command decoder 21 may receive the first command signal CMD1 outputted from the controller 1 to generate the test mode enablement signal TM_EN which is enabled during a first period TD1 that the test mode is executed.

Next, at a point of time "T2", the command decoder 21 may receive the second command signal CMD2 outputted from the controller 1 to generate the test signal TEST which is enabled during a second period TD2 whereby the functions of the memory cells in the first and second cell array blocks are tested. The test circuit 22 may test the function of the first memory cell in the first cell array block during the second period TD2 to extract the first address ADD<1:1> and the first pass/fail information P/F<1:1> on the first memory cell. The test circuit 22 may test the function of the second memory cell in the first cell array block during the second period TD2 to extract the second address ADD<1:2> and the second pass/ fail information P/F<1:2> on the second memory cell. The test circuit 22 may test the function of the third memory cell in the second cell array block during the second period TD2 to extract the third address ADD<2:1> and the third pass/fail information P/F<2:1> on the third memory cell. The test circuit 22 may test the function of the fourth memory cell in the second cell array block during the second period TD2 to extract the fourth address ADD<2:2> and the fourth pass/fail information P/F<2:2> on the fourth memory cell. The first address ADD<1:1>, the first pass/fail information P/F<1:1>, the second address ADD<1:2>, and the second pass/fail information P/F<1:2> may be latched and stored in the first latch unit 231. The third address ADD<2:1>, the third pass/fail information P/F<2:1>, the fourth address ADD<2:2>, and the fourth pass/fail information P/F<2:2> may be latched and stored in the second latch unit 232.

Next, at a point of time "T3", the command decoder 21 may receive the third command signal CMD3 outputted from the controller 1 to generate the burst pulse signal BSTP including a plurality of pulses which are sequentially and respectively created at points of time "T3", "T4", "T5" and "T6".

At the point of time "T3", a pulse of the first selection signal SEL<1> may be generated in synchronization with the first pulse of the burst pulse signal BSTP, and the first address ADD<1:1> and the first pass/fail information P/F<1:1> may be outputted as the selected address ADD_SEL and the selected pass/fail information P/F_SEL, respectively. In such a case, the first address ADD<1:1> may be stored in the fuse array 237 or not according to the first pass/fail information P/F<1:1>. For example, when the first pass/fail information P/F<1:1> has a logic "high" level, the first memory cell may be regarded as an abnormal cell (i.e., a failed cell) and the fuse array 237 may be programmed to store the first address ADD<1:1> therein. In contrast, when the first pass/fail information P/F<1:1> has a logic "low" level, the first memory cell may be regarded as a normal cell and the fuse array 237 is not programmed to prevent the first address ADD<1:1> from being stored therein.

At the point of time "T4", a pulse of the second selection signal SEL<2> may be generated in synchronization with the second pulse of the burst pulse signal BSTP, and the second address ADD<1:2> and the second pass/fail information P/F<1:2> may be outputted as the selected address ADD_SEL and the selected pass/fail information P/F_SEL, respectively. In such a case, the second address ADD<1:2> may be programmed in the fuse array 237 or not according to the second pass/fail information P/F<1:2>. For example, when the second pass/fail information P/F<1:2> has a logic "high" level, the second memory cell may be regarded as an abnormal cell (i.e., a failed cell) and the second address ADD<1:2> may be programmed and stored in the fuse array 237. In contrast, when the second pass/fail information P/F<1:2> has a logic "low" level, the second memory cell may be regarded as a normal cell and the fuse array 237 is not programmed to prevent the second address ADD<1:2> from being stored therein.

At the point of time "T5", a pulse of the third selection signal SEL<3> may be generated in synchronization with the third pulse of the burst pulse signal BSTP, and the third address ADD<2:1> and the third pass/fail information P/F<2:1> may be outputted as the selected address ADD_SEL and the selected pass/fail information P/F_SEL, respectively. In such a case, the third address ADD<2:1> may be programmed in the fuse array 237 or not according to the third pass/fail information P/F<2:1>. For example, when the third pass/fail information P/F<2:1> has a logic "high" level, the third memory cell may be regarded as an abnormal cell (i.e., a failed cell) and the third address ADD<2:1> may be programmed and stored in the fuse array 237. In contrast, when the third pass/fail information P/F<2:1> has a logic "low" level, the third memory cell may be regarded as a normal cell and the fuse array 237 is not programmed to prevent the third address ADD<2:1> from being stored therein.

At the point of time "T6", a pulse of the fourth selection signal SEL<4> may be generated in synchronization with the fourth pulse of the burst pulse signal BSTP, and the fourth address ADD<2:2> and the fourth pass/fail information P/F<2:2> may be outputted as the selected address ADD_SEL and the selected pass/fail information P/F_SEL, respectively. In such a case, the fourth address ADD<2:2> may be programmed in the fuse array 237 or not according to the fourth pass/fail information P/F<2:2>. For example, when the fourth pass/fail information P/F<2:2> has a logic "high" level, the fourth memory cell may be regarded as an abnormal cell (i.e., a failed cell) and the fourth address ADD<2:2> may be programmed and stored in the fuse array 237. In contrast, when the fourth pass/fail information P/F<2:2> has a logic "low" level, the fourth memory cell may be regarded as a normal cell and the fuse array 237 is not programmed to prevent the fourth address ADD<2:2> from being stored therein.

As described above, a semiconductor system including a semiconductor device according to the embodiments may test functions of a plurality of memory cells included in a plurality of cell array blocks of the semiconductor device, thereby latching addresses and pass/fail information on the tested memory cells and selectively programming the addresses of abnormal memory cells among the tested memory cells in a fuse array based on the pass/fail information. That is, the fuse array may be programmed in a test mode to store the addresses of the abnormal memory cells (or failed memory cells) therein. Thereby collecting the addresses of the abnormal memory cells together in the fuse array.

What is claimed is:
1. A semiconductor device comprising:
   a first latch unit suitable for storing a first address of a first memory cell tested in a first cell array block;
   a second latch unit suitable for storing a second address of a second memory cell tested in a second cell array block;
   a first selector suitable for receiving a first selection signal or a second selection signal to output any one of the first address and the second address as a selected address; and
   a program controller suitable for determining whether the selected address has to be stored in a fuse array to control an operation for programming the fuse array,
   wherein each of the first and second selection signals includes a pulse, and
   wherein the pulse of the first selection signal and the pulse of the second selection signal are sequentially created in response to a burst pulse signal generated after the test mode starts.
2. The semiconductor device of claim 1, wherein the first latch unit outputs the first address stored therein to the first selector in a test mode.
3. The semiconductor device of claim 2, wherein the second latch unit outputs the second address stored therein to the first selector in the test mode.
4. The semiconductor device of claim 1, wherein the first selector outputs the first address as the selected address when the pulse of the first selection signal is inputted thereto and outputs the second address as the selected address when the pulse of the second selection signal is inputted thereto.

5. The semiconductor device of claim 1,
wherein the first latch unit stores a first pass/fail information on the first memory cell therein; and
wherein the second latch unit stores a second pass/fail information on the second memory cell therein.

6. The semiconductor device of claim 5, further comprising a second selector suitable for receiving the first selection signal or the second selection signal to output any one of the first pass/fail information and the second pass/fail information as a selected pass/fail information.

7. The semiconductor device of claim 6, wherein the program controller is suitable for determining whether the selected address has to be stored in the fuse array based on the selected pass/fail information to control an operation for programming the fuse array.

8. A semiconductor device comprising:
a first latch unit suitable for storing a first address of a first memory cell and a second address of a second memory cell, the first memory cell and the second memory cell being tested in a first cell array block;
a second latch unit suitable for storing a third address of a third memory cell and a fourth address of a fourth memory cell, the third and fourth memory cells being tested in a second cell array block;
a first selector suitable for receiving one of first to fourth selection signals to output any one of the first to fourth addresses as a selected address; and
a program controller suitable for determining whether the selected address has to be stored in a fuse array to control an operation for programming the fuse array,
wherein each of the first to fourth selection signals includes a pulse, and
wherein the pulse of the first selection signal, the pulse of the second selection signal, the pulse of the third selection signal, and the pulse of the fourth selection signal are sequentially created in response to a burst pulse signal generated after a test mode starts.

9. The semiconductor device of claim 8,
wherein the first selector outputs the first address as the selected address when the pulse of the first selection signal is inputted thereto;
wherein the first selector outputs the second address as the selected address when the pulse of the second selection signal is inputted thereto;
wherein the first selector outputs the third address as the selected address when the pulse of the third selection signal is inputted thereto; and
wherein the first selector outputs the fourth address as the selected address when the pulse of the fourth selection signal is inputted thereto.

10. The semiconductor device of claim 8,
wherein the first latch unit stores a first pass/fail information on the first memory cell and a second pass/fail information on the second memory cell therein; and
wherein the second latch unit stores a third pass/fail information on the third memory cell and a fourth pass/fail information on the fourth memory cell therein.

11. The semiconductor device of claim 10, further comprising a second selector suitable for receiving one of the first to fourth selection signals to output any one of the first pass/fail information, the second pass/fail information, the third pass/fail information and the fourth pass/fail information as a selected pass/fail information.

12. A semiconductor system comprising:
a controller suitable for sequentially generating a first command signal, a second command signal and a third command signal; and
a semiconductor device suitable for receiving the first command signal to operate in a test mode, suitable for receiving the second command signal to test memory cells included in first and second cell array blocks and to extract and latch addresses and pass/fail information on the tested memory cells, suitable for receiving the third command signal to sequentially generate a pulse of a first selection signal and a pulse of a second selection signal, and suitable for controlling an operation for programming a fuse array in response to the pulses of the first and second selection signals,
wherein the fuse array is programmed according to the pass/fail information, and
wherein at least one of the addresses of the tested memory cells is stored in the fuse array when the fuse array is programmed,
wherein each of the first and second selection signals includes a pulse; and
wherein the pulse of the first selection signal and the pulse of the second selection signal are sequentially created in response to a burst pulse signal generated after the test mode starts.

13. The semiconductor system of claim 12, wherein the semiconductor device includes:
a command decoder suitable for receiving the first, second and third command signals to generate a test mode enablement signal, a test signal and a burst pulse signal;
a test circuit suitable for testing functions of the memory cells in response to the test signal in a test mode activated by the test mode enablement signal to extract a first address of a first memory cell tested in the first cell array block and a second address of a second memory cell tested in the second cell array block; and
a fuse program circuit suitable for latching the first and second addresses and suitable for receiving the burst pulse signal to control an operation for programming the fuse array,
wherein the operation for programming the fuse array is executed to store at least one of the first and second addresses in the fuse array.

14. The semiconductor system of claim 13, wherein the fuse program circuit includes:
a first latch unit suitable for storing the first address;
a second latch unit suitable for storing the second address;
a first selector suitable for receiving one of the first and second selection signals to output any one of the first and second addresses as a selected address; and
a program controller suitable for controlling the operation for programming the fuse array.

15. The semiconductor system of claim 14, wherein the first selector outputs the first address as the selected address when the pulse of the first selection signal is inputted thereto and outputs the second address as the selected address when the pulse of the second selection signal is inputted thereto.

16. The semiconductor system of claim 14,
wherein the first latch unit stores a first pass/fail information on the first memory cell therein; and
wherein the second latch unit stores a second pass/fail information on the second memory cell therein.

17. The semiconductor system of claim 16, further comprising a second selector suitable for receiving the first selection signal or the second selection signal to output any one of the first pass/fail information and the second pass/fail information as selected pass/fail information.

* * * * *